United States Patent [19]

Yu

[11] Patent Number: 5,394,357
[45] Date of Patent: Feb. 28, 1995

[54] NON-VOLATILE SEMICONDUCTOR MEMORY DEVICE

[76] Inventor: Shih-Chiang Yu, 10451 Davison Ave., Culpertine, Calif. 95014

[21] Appl. No.: 24,258

[22] Filed: Mar. 1, 1993

[51] Int. Cl.6 ............................................. G11C 11/34
[52] U.S. Cl. ..................................... 365/182; 365/185
[58] Field of Search .................... 365/182, 185, 49, 45

[56] References Cited

U.S. PATENT DOCUMENTS 5,111,430 5/1992 Morie ................................. 365/185

FOREIGN PATENT DOCUMENTS 63-169070 7/1988 Japan .
0369676 5/1990 Japan .
3-29371 2/1991 Japan .

Primary Examiner—Viet Q. Nguyen
Attorney, Agent, or Firm—Kam T. Tam

[57] ABSTRACT

A non-volatile semiconductor memory cell includes a floating gate dielectrically disposed between a first and a second control gate. The non-volatile memory cell can only be addressed for programming or deprogramming by the simultaneous energization of the first and second control gates. With this unique feature, any memory cell in an memory array can be randomly accessed. Moreover, the two control gates associated with each of the floating gate also increase the coupling capacitances, thereby speeding up operations. The non-volatile memory device of the present invention is ideal to be used for large scale integration applications in which memory cells are arranged in a NAND structure.

7 Claims, 5 Drawing Sheets

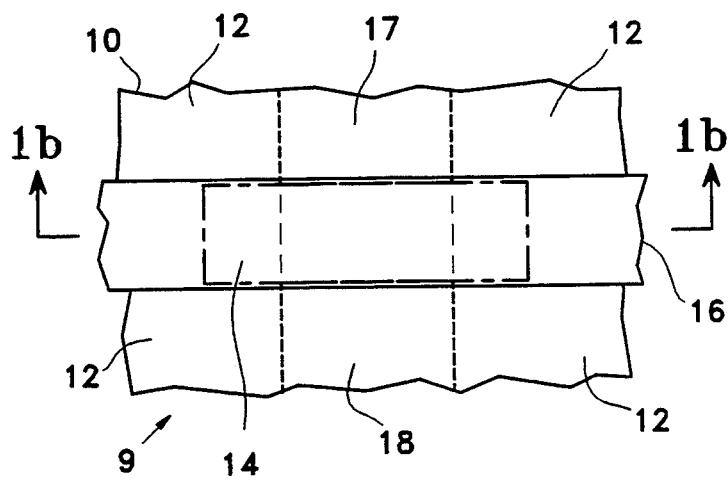
Fig. 1a
(PRIOR ART)
Fig. 1b
(PRIOR ART)
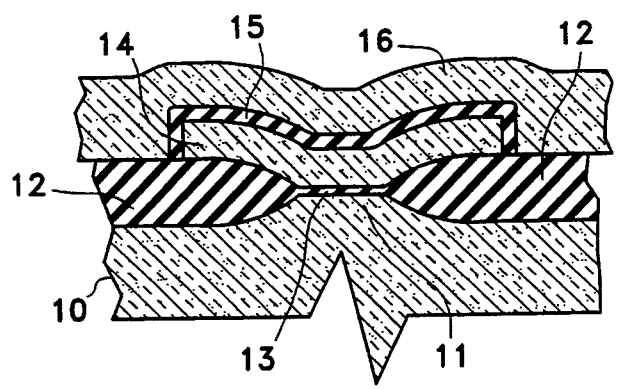
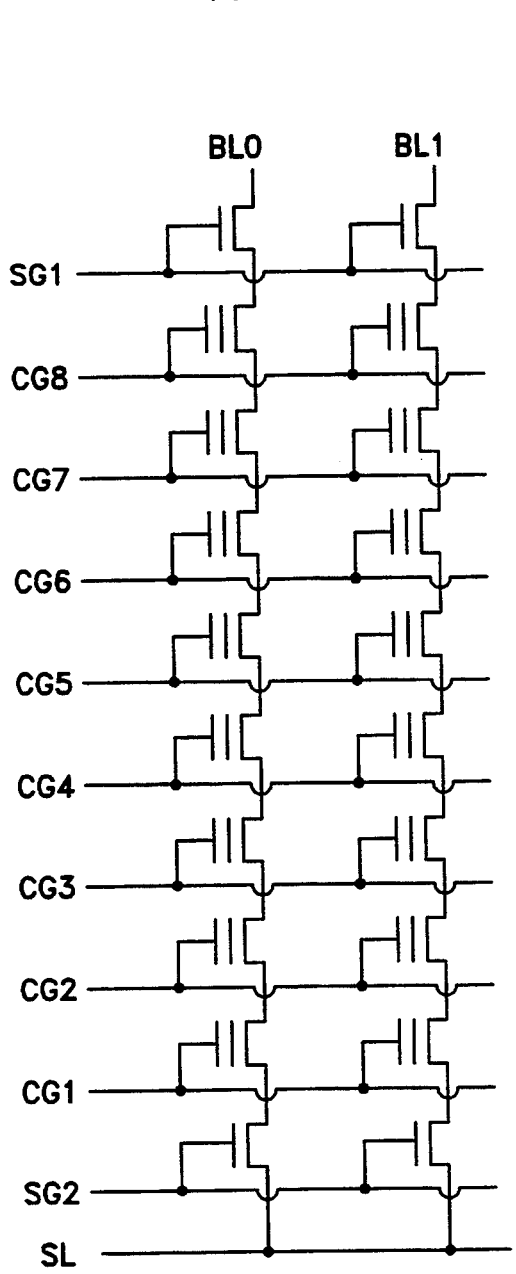
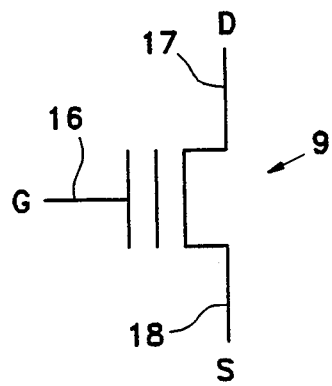
Fig. 1c
(PRIOR ART)
Fig. 2
(PRIOR ART)

NON-VOLATILE SEMICONDUCTOR MEMORY DEVICE

BACKGROUND OF THE INVENTION

1. Field of the Invention

The present invention relates to semiconductor memory devices, and in particular, to non-volatile semiconductor Electrically Erasable Programmable Read-Only Memory (EEPROM) cells.

2. Description of the Related Art

There are different kinds of EEPROM device for various types of application. For the case where high density integration of memory cells is essential, there is one type of EEPROM circuit that connects the individual memory cells in a NAND structure. Data are written in and read out of the memory cells serially. FIG. 1a is a top plan view of such a circuit. FIG. 1b is a cross-sectional side view taken along line 1b—1b of FIG. 1a. As is shown, each memory cell relies on thick field oxide regions 12 for cell-to-cell isolations. Disposed atop thin tunneling oxide 13 and portions of field oxide 12 is a polysilicon floating gate 14. Overlying floating gate 14 is a control gate 16. An insulating layer 15 is disposed in between floating gate 14 and control gate 16. Drain 17, source 18, and channel 11, which together constitutes a Metal-Oxide-Semiconductor Field Effect Transistor (MOSFET) 9, are also formed in the semiconductor substrate 10. FIG. c is a schematic representation of the memory cell shown in FIGS. 1a and 1b, in which the alphabets G, D, and S are used to represent control gate 16, drain 17 and source 18, respectively. FIG. 2 shows the memory cells of FIGS. 1a and 1b arranged in a NAND structure, in which a plurality of memory cells are connected in series. As is shown, sources S and drains D of the adjacent cells in a column are connected together to form bitlines BL0 and BL1. In a similar manner, gates G of the memory cells in a row are connected together to form control lines CG1, CG2, ..., and CG8. There are also control transistors without any floating gates primarily implemented for the addressing of the memory cells. These control transistors are controlled by select lines such as SG1 and SG2. Examples of this type of EEPROM circuit can be found in Shirota et al., entitled "A 2.3 um$^2$ Memory Cell Structure for 16Mb NAND EEPROMs", IEDM 1990, Technical Digest, pp 103–106; and in Momodomi et al., entitled "New Device Technologies For 5V-Only 4Mb EEPROM With NAND Structure CEll" IEDM 1988, Technical Digest, pp 412–415.

As with most EEPROM circuits, circuits of the aforementioned type utilize the Fowler-Nordheim Tunneling (FNT) effect for the programming (or writing) and deprogramming (or erasure) of the memory cells.

Deprogramming is a process of setting the threshold voltage of the MOSFET in each of the memory cells to a predetermined value, depending on the logic convention used in the EEPROM circuit. For example, in this case, either a +2 Volts or a −2 Volts threshold voltage of the MOSFET can be used to correspond the logical bit "0". To deprogram the memory cells such that each of the MOSFETs 9 assumes a threshold voltage of +2 Volts, all control lines CG1–CG8 are energized to +22 Volts and the substrate is tied to the ground potential. Through the process of capacitive coupling, each of the floating gates 14 is coupled with a +11 Volts potential, for example. The +11 Volts voltage at floating gate 14 is sufficient to attract electrons from channel 11 through thin tunneling oxide layer 13 via the FNT effect. As a result, the channel 14 is depleted of electrons and MOSFET 9 assumes a threshold voltage of +2 Volts. To deprogram the memory cells such that each of the MOSFET's threshold voltage falls below the ground potential to −2 Volts. The mechanism is similar as mentioned above except that the source 18 now needs to be electrically connected to a potential of approximately +20 Volts and the control lines CG1–CG8 are tied to the ground potential.

Programming is the reverse of deprogramming. Again, depending on the logic convention used in the EEPROM circuit, if a +2 Volts threshold for the MOSFET 9 in each of the memory cells is used to correspond a logical bit "0", for example, programming is the process of reversing the threshold voltage to −2 Volts. Alternatively, if the −2 Volts threshold for the MOSFET 9 in each of the memory cells is used to correspond a logical bit "0", programming is the process of reversing the threshold voltage to +2 Volts. For the sake of a concise and clear illustration, only the latter case is herein elaborated. That is, to reverse the deprogrammed threshold voltage of −2 Volts to +2 Volts, a +18 Volts is first applied to the control lines CG1–CG8 of the selected memory cell. Through the process of capacitive coupling, each floating gate is coupled with +10 Volts. At the same time, control lines CG1—CG8 of unselected memory cells are tied to +7 Volts. Again, through the process of capacitive coupling, each floating gate is approximately coupled with +4 Volts, which is insufficient to cause any FNT effect. Select lines SG1 and SG2, are then powered up to +7 Volts and 0 Volt, respectively. Moveover, bitlines BL0 and BL1 are electrically connected to +7 Volts while source line SL is tied to the ground potential. Selected memory cells with a coupled +10 Volts at the floating gate 14 is sufficient to attract electrons from the underlying channel via the FNT effect. The channel is then depleted of electrons and as a consequence, the MOSFET 9 in each of the selected memory cells changes to −2 Volts. It should be note that memory cells in a column are connected in a NAND structure, as shown in FIG. 2. For this reason, each of the memory cells needs to be programmed sequentially such that each memory cell is first programmed to be conductive and acts as a conducting path between the source line and the subsequent cells. In this case, the first cell to be programmed is the cell connected to control line CG1 and the last cell to be programmed is the cell connected to control line CG8.

As is shown, the high integration feature of the memory cells is compromised by the complexity of the programming process. Each memory cell in the array can not be randomly and individually accessed. This restriction causes much inconvenience during applications.

It is accordingly an objective of the present invention to provide a non-volatile semiconductor memory circuit in which each memory cell can be programmed or deprogrammed randomly without resorting to identify a block of cells and the addressing each of the cells sequentially. Another objective is to provide a memory cell with a high gate capacitance coupling ratio which further speeds up the programming and deprogramming processes.

These and other objectives are accomplished by an unique structural design of the memory cell of the present invention.

SUMMARY OF THE INVENTION

In accordance with the present invention, there is provided a non-volatile semiconductor memory cell including a source and a drain formed in a semiconductor substrate of a first conductivity type. A channel is defined in between the source and the drain. A first polysilicon control gate is dielectrically formed atop the channel. Dielectrically underlying the first control gate in the channel is a diffusion region of a second conductivity type. A floating gate is also disposed atop the first control gate through an insulating layer. In addition, a second control gate is also dielectrically formed atop the floating gate. Cell-to-cell isolations are accomplished by thick field oxide regions.

A plurality of memory cells of the present invention can be arranged in a matrix of rows and columns, with the first control gates in each of the memory cells in a row being connected together to form X-control lines, and with the second control gates in each of the memory cells in a column being connected together to form Y-control lines. Any memory cell in the matrix can be programmed or deprogrammed randomly by a simultaneous energization of a pair of selected X-control and Y-control lines criss-crossing the selected memory cell.

DESCRIPTION OF THE DRAWINGS

FIG. 1a is top plan view of a prior art memory cell capable of being connected in a NAND structure in a memory array.

FIG. 1b is a cross-sectional side view taken along line 1b–1b of FIG. 1a.

FIG. 1c is a schematic representation of the memory cell shown in FIG. 1a.

FIG. 2 is a schematic representation of a memory array comprised of memory cells of FIGS. 1a–1c arranged in a NAND structure.

FIG. 3b is a cross-sectional side view taken along line 3b—3b of FIG. 3a.

FIG. 3c is a cross-sectional side view taken along line 3c—3c of FIG. 3a.

DETAILED DESCRIPTION OF THE INVENTION

Figure 3A:
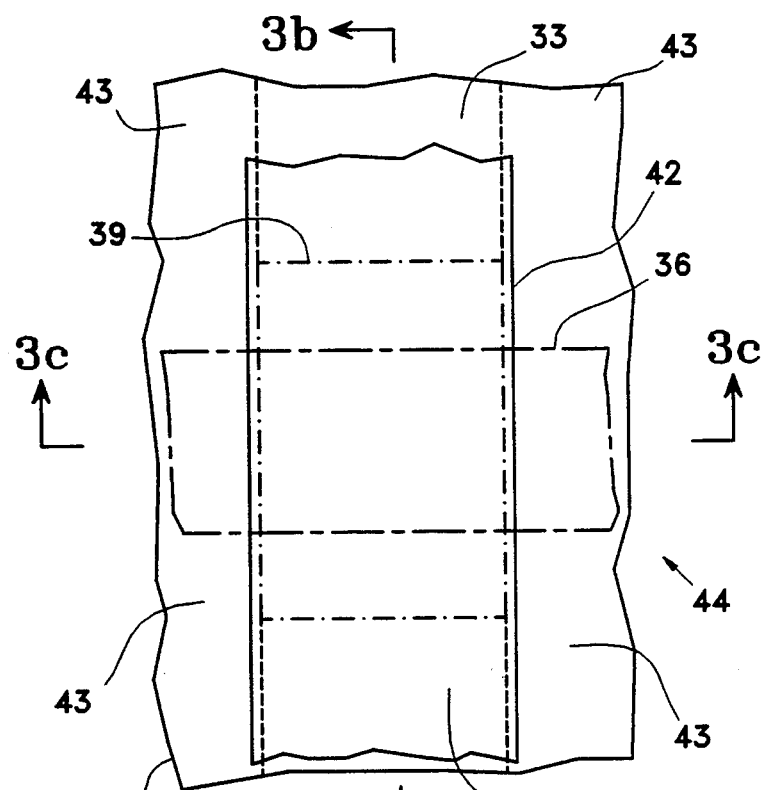
FIG. 3a is a top plan view of a first embodiment of the memory cell of the present invention.
Figure 3B:
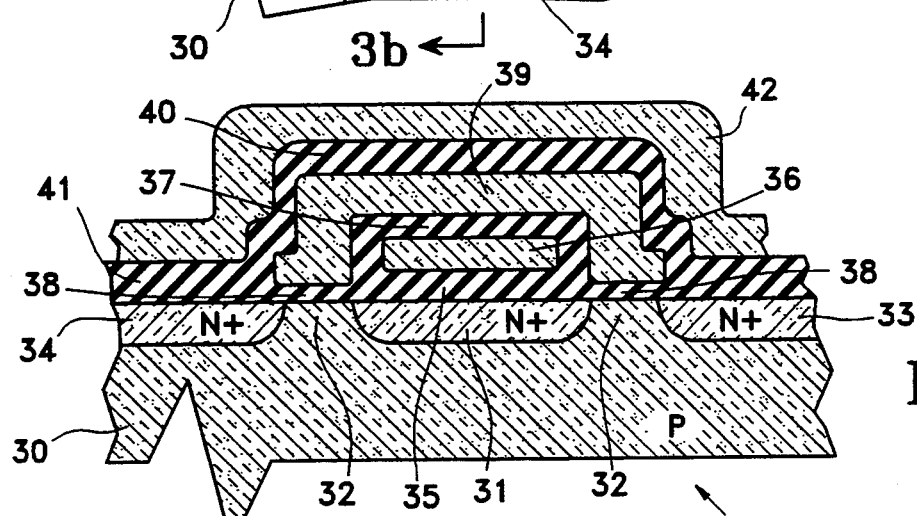
Figure 3C:
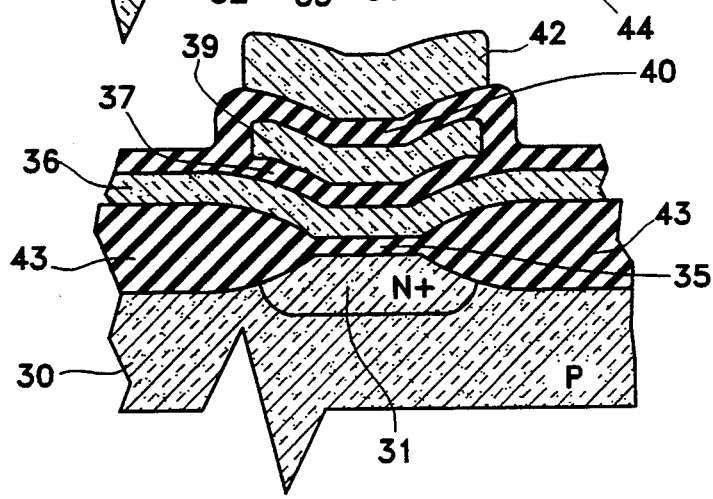

Reference is now made to FIGS. 3a–3c which show a first embodiment of the memory cell of the present invention. FIG. 3a is a top plan view of the memory cell. FIGS. 3b and 3c are cross-sectional side views taken along lines 3b—3b and 3c—3c, respectively, of FIG. 3a. In this embodiment, formed in P-type semiconductor substrate 30, for example, are drain region 33 and source region 34. Dielectrically disposed atop substrate 30 and between drain 33 and source 34 is a first control gate 36. Dielectrically formed underneath the first control gate 36 is a N-type diffusion region 31. Defined between source 34, drain 33, and diffusion regions 31 are channels 32. Source 34, drain 3 and channels 32 formed in semiconductor substrate 30 constitutes a MOSFET 44. A floating gate 39 is also formed atop the first control gate 36 and insulated by insulating layer 37. There are also thin tunneling layers 38 which separate the floating gate 39 and the channels 32. A second control gate 42 is also dielectrically formed atop floating gate 39. Disposed between second control gate 42 and substrate 30, and between second control gate 42 and floating gate 39 are insulating layers 41 and 40, respectively. Cell-to-cell isolations are accomplished by thick field oxide regions 43.

Figure 4:
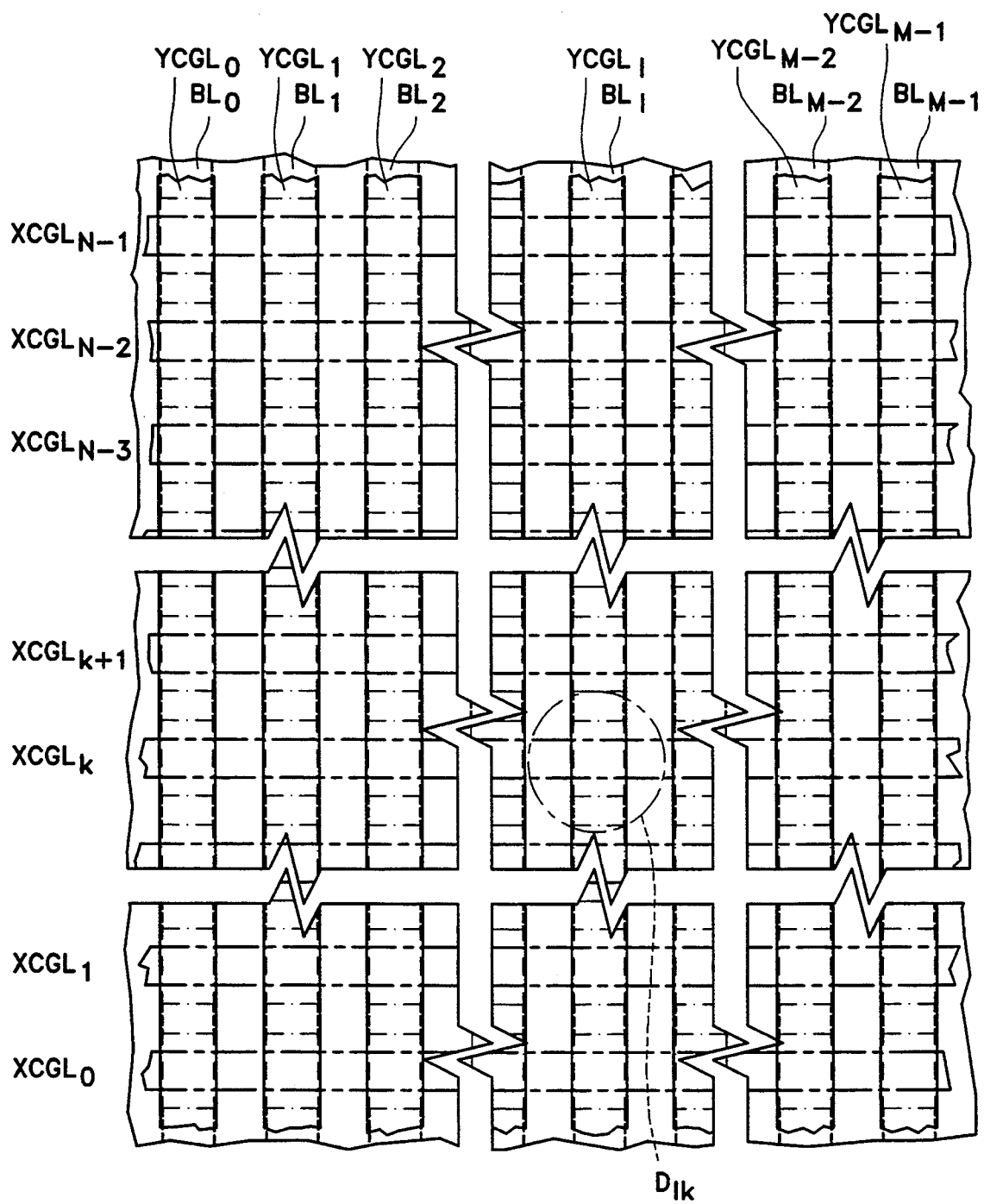
FIG. 4 is a top plan view of a memory array comprised of memory cells of FIGS. 3a–3c arranged in a matrix of rows and columns.
Figure 5:
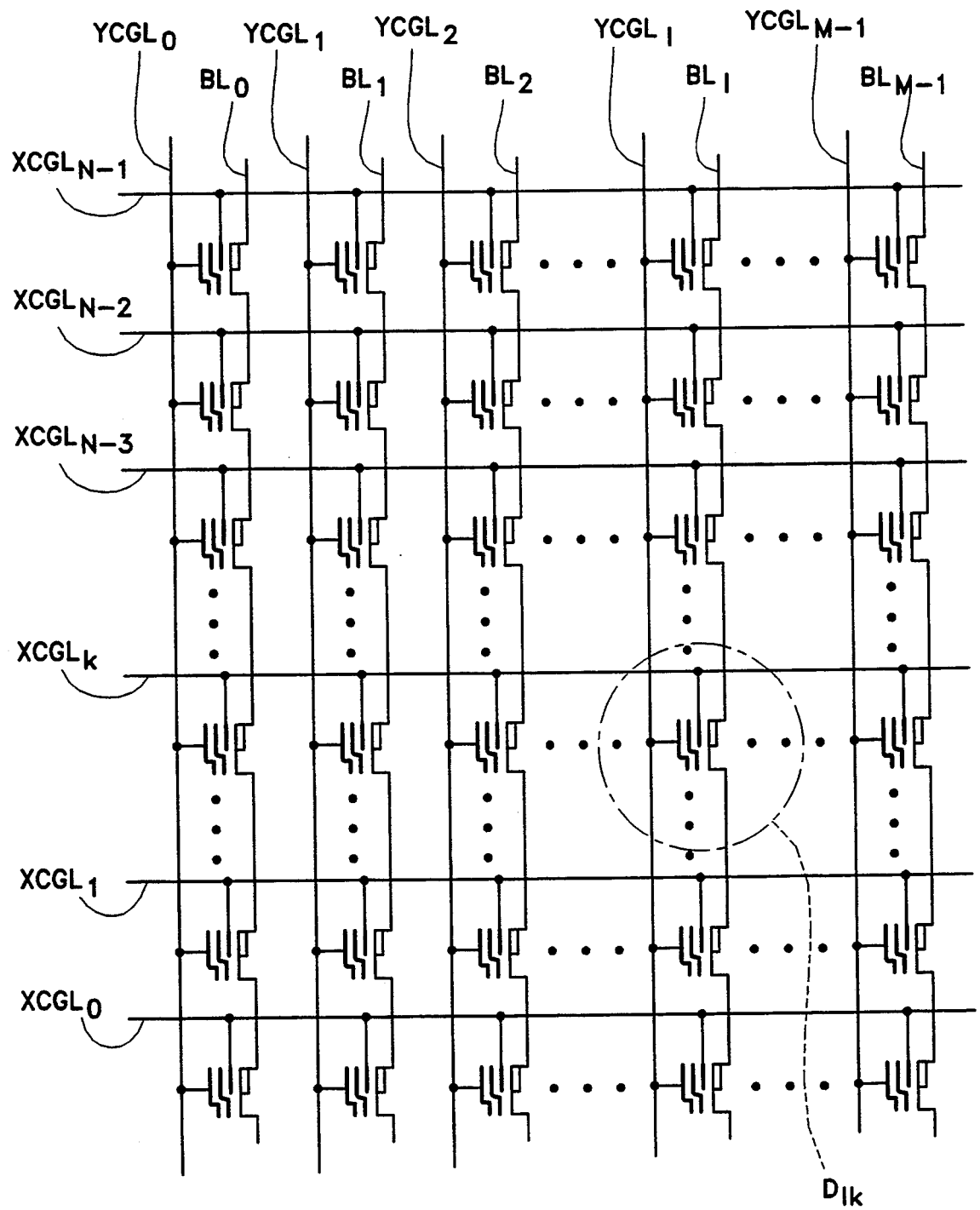
FIG. 5 is a schematic representation of the memory array of FIG. 4.

A plurality of memory cells of the present invention can be arranged in a matrix of rows and columns. FIG. 4 is a plan view of such a matrix arrangement having N rows and M columns, where N and M are integers. In the M×N matrix, first control gates 36 of each of the memory cells in a row are connected together to form X-control lines XCGLs. Similarly, second control gates 42 of each of the memory cells in a column are connected together to form Y-control lines YCGLs. Drains 33 and sources 34 of each of the adjacent memory cells in a column are also connected together to form bitlines BLs. FIG. 5 is a schematic representation of the memory cell array shown in FIG. 4.

Each memory cell in the memory array is capable of three operations, namely, programming, deprogramming, and reading.

In the memory array as shown in FIGS. 4 and 5, to deprogram a memory cell $D_{lk}$ in the kth row and the lth column, the selected X-control line $XCGL_k$ and Y-control line $YCGL_l$ lines must first be simultaneously energized to +20 Volts. All other control lines can be tied to the ground potential. Assuming that there is a coupling efficiency of 35% between the floating gate 39 and each of the control gates 36 and 42 (FIGS. 3a and 3b), the floating gate of each of the memory cells under either the energized X-control line $XCGL_k$ or Y-control line $YCGL_l$ will be capacitively coupled with a voltage of +7 Volts. However, the floating gate of memory cell $D_{lk}$ will be coupled with twice that value, that is +14 Volts, since it is under both the simultaneously energized X-control line $XCGL_k$ and the Y-control line $YCGL_l$. It should be noted that a memory cell with a +7 Volts coupled in the floating gate is insufficient to cause any FNT effect. However, the floating gate of memory cell $D_{lk}$ capacitively coupled with a +14 Volts value is sufficient to trigger the FNT effect, in which electrons from channels 32 are attracted to the positively coupled floating gate 39 through thin tunnelling layers 38 (FIGS. 3a and 3b). As a consequence, channels 32 of memory cell $D_{lk}$ is depleted with electrons, and the threshold voltage of MOSFET 44 is raised to +2 Volts. Memory cell $D_{lk}$ is said to be deprogrammed with a logical bit "0" for example.

The process of programming is similar to the process of deprogramming but with the applied potentials reversed in polarity. For example, to program memory cell $D_{lk}$, the selected X-control line $XCGL_k$ and Y-control line $YCGL_l$ lines must first be simultaneously energized to −20 Volts this time. All other control lines can be tied to the ground potential. Again, with a coupling efficiency of approximately 35% between the floating gate 39 and each of the control gates 36 and 42 (FIGS. 3a and 3b), the floating gate in each of the memory cells under either the energized X-control line $XCGL_k$ or Y-control line $YCGL_l$ will be capacitively coupled with a voltage of −7 Volts. However, the floating gate of memory cell $D_{lk}$ will be coupled with twice that value, that is −14 Volts, because it is under both energized X-control line $XCGL_k$ and the Y-control line $YCGL_l$. As was explained before, a memory cell with a −7 Volts value coupled in the floating gate does not have enough magnitude to initiate any FNT effect. However, the floating gate of memory cell $D_{lk}$ which is capacitively coupled with a −14 Volts voltage value can trigger the FNT effect, in which electrons from the negatively charged floating gate 39 are repelled to channels 32 through the thin tunnelling layers 38 (FIGS. 3a and 3b). As a result, channels 38 of memory cell $D_{lk}$ accumulate with an excess of electrons, and the threshold voltage of MOSFET 44 is lowered to −2 Volts. Memory cell $D_{lk}$ is said to be programmed with a logical bit "1", for example.

Reading information stored in memory cell $D_{lk}$ involves the energization of the bitline $BL_l$, the X-control line $XCGL_k$, and the Y-control line $YCGL_l$ to +5 Volts, 0 Volt, and +5 Volts, respectively. At the same time, the bitlines, the X-control lines and the Y-control lines of all other memory cells are tied to 0 Volt, +5 Volts to 0 Volt, respectively. Suppose memory cell $D_{lk}$ has previously been programmed with a +2 Volts threshold voltage in MOSFET 44, Floating gate 39, with the capacitively coupled voltage of 1.75 Volts this time, is insufficient to turn the channels 32 on. No current can therefore flow between drain 33 to source 34. As a result, the digital bit "0" is said to be read. On the contrary, if memory cell $D_{lk}$ is pre-programmed with a −2 Volts threshold voltage in MOSFET 44, the coupled 1.75 Volts in floating gate 39 can turn channels 32 on and current flows from drain 33 to source 34. This time, the digital bit "1" is said to be read.

Figure 6A:
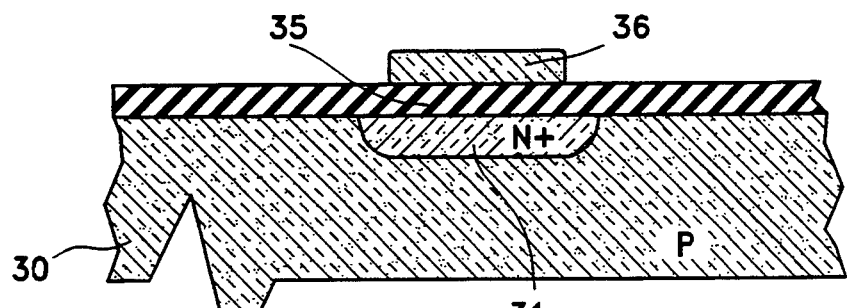
FIGS. 6a–6c are sequential drawings illustrating the fabrication of the memory cells of FIGS. 3a–3c at different stages of the fabrication process.
Figure 6B:
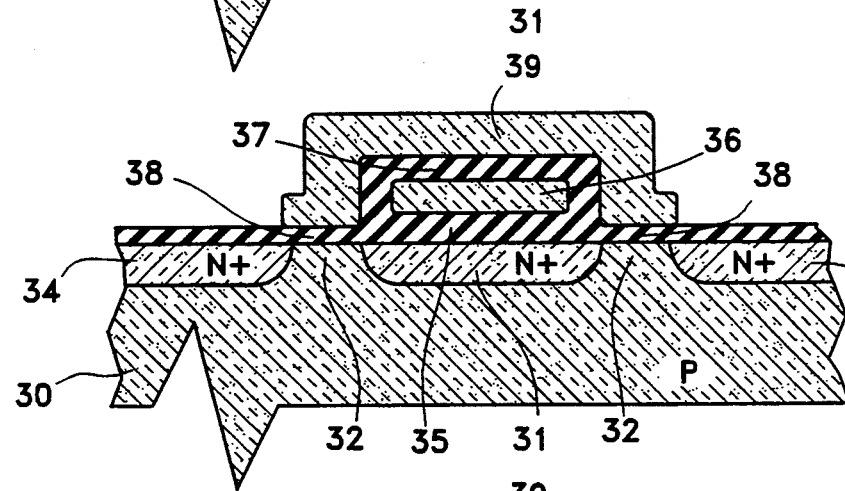
Figure 6C:
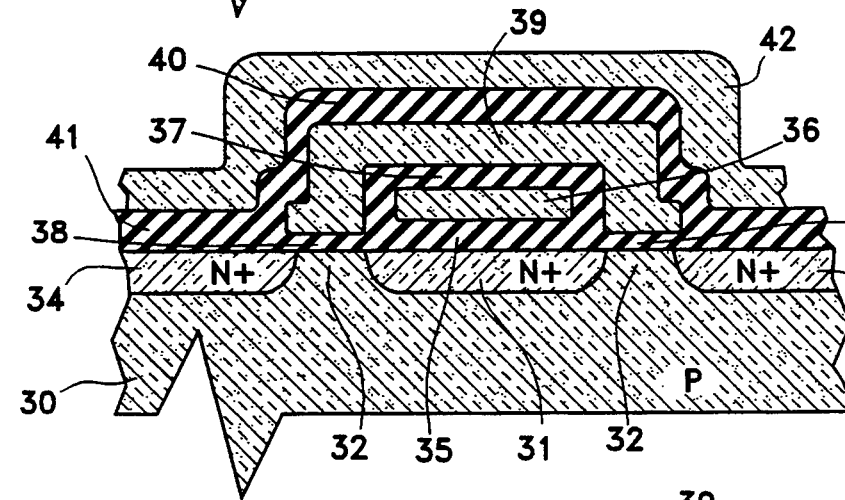

FIGS. 6a–6c are sequential drawings illustrating the making of the memory cell of the present invention at different stages of the fabrication process. To begin with, a P-type semiconductor substrate 30 is provided onto which a thick field oxide layer 43 (FIG. 3c) of approximately 1 micrometer is grown. The thick field oxide 43 is then masked and etched by the conventional methods for the formation of openings for the ion implantation of N+ diffusion regions 31. In the preferred method, the ions used for implantation are arsenic (As) and the dosage is set at $5 \times 10^{12}$ cm$^{-2}$. Thereafter, an oxide insulating layer 35 of approximately 50 nanometers is thermally grown on the substrate. A polysilicon layer of approximately 400 nanometers is then deposited atop the resultant substrate and the polysilicon layer is also doped to a resistance of 6 Ohms. Conventional masking and etching techniques are again employed to define first control gates 36. FIG. 6a shows the resultant structure up to this step. Insulating oxide layer 37 of approximately 50 nanometers is then grown over first control gate 36. Alternatively, insulating oxide lager 37 can be substituted with a 30 nanometer of oxide equivalent thickness of oxide-nitride-oxide composite layer. Masking and etching steps are again employed to define thin tunnelling layers 38. Afterwards, thin oxide layer of approximately 11 nanometers is thermally grown on the substrate. Another layer of polysilicon of approximately 300 nanometers is then deposited atop the resultant structure and the polysilicon layer is further doped to a resistance of 6 Ohms. Conventional masking and etching steps are again utilized to define floating gate 39. Thereafter, arsenic ions are implanted in the substrate 30 to define source 34 and drain 33. FIG. 6b shows the resultant structure up to this step. Another oxide insulating layer 40 of approximately 50 nanometers is then formed atop the resultant substrate. Alternatively, oxide insulating layer 40 can be replaced by a 30 nanometers oxide equivalent thickness of oxide-nitride-oxide composite layer. Afterwards, a third layer of polysilicon of approximately 400 nanometers is deposited and doped to a 4 Ohm resistance on the top of the substrate. It should be noted that first and second control gates 36 and 42 can comprise refractory silicide, such as tungsten silicide or titanium silicide, or metal, instead of polysilicon. Finally masking and etching steps are again employed to define second control gate 42. FIG. 6c shows the final structure up to this step.

Figure 7:
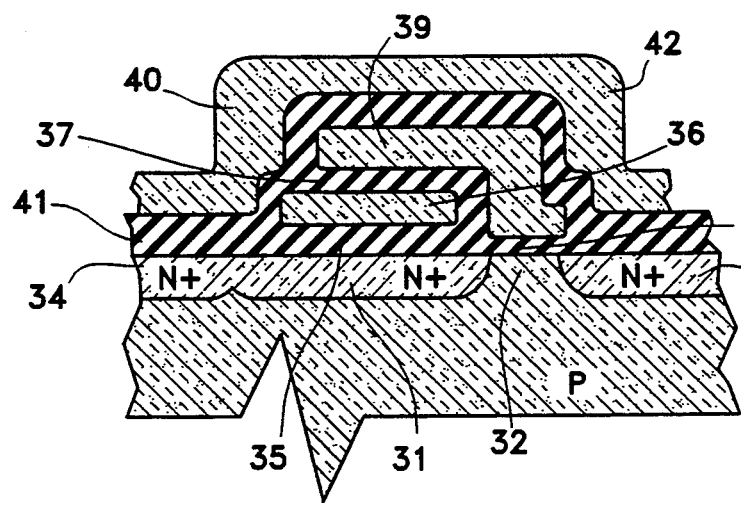
FIG. 7 is a cross-sectional side view of a second embodiment of the present invention.

Shown in FIG. 7 is a second embodiment of the present invention. In this embodiment, floating gate 39 is only partially dielectrically overlying first control gate 36. Furthermore, N+ diffusion region 31 merges with source 34 and there is only one channel region 32. The operational details of this embodiment is substantially the same as the previous embodiment and needs no further elaboration in here.

Finally other changes are possible within the scope of the invention. While the present invention has been shown and described with reference to preferred embodiments thereof, it will be understood by those skilled in the art that other changes in form and detail may be made therein without departing from the scope and spirit of the invention as defined in the appended claims.

What is claimed is:

1. A non-volatile memory cell comprising:
   a semiconductor substrate of a first conductivity type;
   a source formed in said semiconductor substrate;
   a drain formed is said semiconductor substrate and spaced from said source;
   a diffusion region of a second conductivity type formed in said semiconductor substrate and between said source and said drain;
   channels formed between said diffusion region and said drain, and between said diffusion region and said source;
   a first control gate dielectrically disposed atop said diffusion region;
   a floating gate dielectrically disposed atop said first control gate and said channels; and
   a second control gate dielectrically disposed atop said floating gate;
   wherein when said first and second control gates are substantially simultaneously energized to a first set of potential values, electrical charges are couplingly induced into said floating gate from said channels by the Fowler-Norheim tunneling effect allowing said floating gate to couplingly vary the conductivity of said channels after the de-energization of said control gates, thereby enabling the non-volatile memory cell to be programmable, and wherein when said first and second control gates are substantially simultaneously energized to a second set of potential values, electrical charges are coupling induced out of said floating gate to said channel by the Fowler-Nordheim tunneling effect allowing said floating gate to couplingly vary the conductivity of said channels after the de-energization of said control gates, thereby enabling the nonvolatile memory cell to be deprogrammable.

2. The non-volatile memory cell as set forth in claim 1 wherein said first and second control gates comprise polysilicon.

3. The non-volatile memory cell as set forth in claim 1 wherein said first and second control gates comprise refractory silicide.

4. The non-volatile memory cell as set forth in claim 1 wherein said first and second control gates comprise metal.

5. A memory cell array formed in a semiconductor substrate including a plurality of non-volatile memory cells, each of said non-volatile memory cell comprising:
a source formed in said semiconductor substrate;
a drain formed in said semiconductor substrate spaced from said source;
a diffusion region formed in said semiconductor substrate, and between said source and said drain;
channels formed between said diffusion region and said drain, and between said diffusion region and said source;
a first control gate dielectrically disposed atop said diffusion region;
a floating gate dielectrically disposed atop said first control gate and said channels; and
a second control gate dielectrically disposed atop said floating gate;
wherein said plurality of non-volatile memory cells being disposed in the semiconductor substrate in a matrix of rows and columns with each of said first control gates in each of said rows of said matrix being electrically connected together, and with each of said second control gates in each of said columns of said matrix being electrically connected together, thereby allowing each of said non-volatile memory cells to be selectively programmed when the selected first and second control gates are substantially simultaneously energized to a first set of potential values, and thereby allowing each of said non-volatile memory cells to be selectively deprogrammed when the selected first and second control gates are substantially simultaneously energized to a second set of potential values.

6. A non-volatile memory cell comprising;
a semiconductor substrate;
a drain formed in said semiconductor substrate;
a source formed in said semiconductor substrate and spaced from said source;
a diffusion region formed in said semiconductor substrate, said diffusion region being formed between said source and said drain and defining at least one channel therebetween;
a first control gate dielectrically disposed atop said diffusion region;
a floating gate dielectrically disposed atop said first control gate and said at least one channel; and
a second control gate dielectrically disposed atop said first control gate;
wherein when said first and second control gates are substantially simultaneously energized to a first set of potential values, electrical charges are couplingly induced into said floating gate from said at least one channel allowing said floating gate to couplingly vary the conductivity of said at least one channel after the de-energization of said control gates, thereby enabling the non-volatile memory cell to be programmable, and wherein when said first and second control gates are substantially simultaneously energized to a second set of potential values, electrical charges are coupling induced out of said floating gate to said at least one channel allowing said floating gate to couplingly vary the conductivity of said channel after the de-energization of said control gates, thereby enabling the non-volatile memory cell to be deprogrammable.

7. The non-volatile memory cell as set forth in claim 6 wherein said first and second control gates are disposed on the semiconductor substrate substantially perpendicular to each other.

* * * * *